(12) United States Patent
Schmidt

(10) Patent No.: US 11,876,144 B2
(45) Date of Patent: Jan. 16, 2024

(54) PHOTOSENSITIVE SEMICONDUCTOR COMPONENT, METHOD FOR FORMING A PHOTOSENSITIVE SEMICONDUCTOR COMPONENT

(71) Applicant: Vishay Semiconductor GmbH, Heilbronn (DE)

(72) Inventor: Manuel Schmidt, Waghausel (DE)

(73) Assignee: Vishay Semiconductor GmbH, Waghausel (DE)

(*) Notice: Subject to any disclaimer, the term of this patent is extended or adjusted under 35 U.S.C. 154(b) by 216 days.

(21) Appl. No.: 17/042,686

(22) PCT Filed: Mar. 28, 2019

(86) PCT No.: PCT/EP2019/057847
§ 371 (c)(1),
(2) Date: Sep. 28, 2020

(87) PCT Pub. No.: WO2019/185787
PCT Pub. Date: Oct. 3, 2019

(65) Prior Publication Data
US 2021/0126150 A1    Apr. 29, 2021

(30) Foreign Application Priority Data
Mar. 29, 2018 (DE) .......................... 102018107611.8

(51) Int. Cl.
*H01L 31/11* (2006.01)
*H01L 31/18* (2006.01)
(52) U.S. Cl.
CPC .......... *H01L 31/1105* (2013.01); *H01L 31/18* (2013.01)

(58) Field of Classification Search
CPC ............... H01L 31/103; H01L 31/1105; H01L 31/1133; H01L 31/1136
See application file for complete search history.

(56) References Cited

U.S. PATENT DOCUMENTS

| | | | |
|---|---|---|---|
| 3,601,668 A | 8/1971 | Slaten et al. | |
| 4,649,409 A | 3/1987 | Roppongi et al. | |
| 5,223,919 A | 6/1993 | Whight et al. | |
| 5,245,204 A | 9/1993 | Morishita | |
| 5,598,023 A * | 1/1997 | Matsumoto | H01L 31/1105 257/443 |
| 6,759,694 B1 | 7/2004 | Hsu | |
| 7,145,121 B1 | 12/2006 | Cook | |

(Continued)

FOREIGN PATENT DOCUMENTS

| | | |
|---|---|---|
| EP | 0105386 A1 | 4/1984 |
| EP | 0436335 A2 | 7/1991 |

(Continued)

*Primary Examiner* — Calvin Y Choi
(74) *Attorney, Agent, or Firm* — Volpe Koenig

(57) ABSTRACT

A photosensitive transistor is disclosed herein that includes: a semiconductor substrate of the first conductivity type as a collector layer; above it a less doped layer of the first conductivity type having regions of different thickness; a semiconductor base layer of the second conductivity type above at least parts of the regions of the less doped layer; and an emitter layer of the first conductivity type above at least parts of the base layer, but not above at least one part of the part of the base layer disposed above the thinner region of the less doped layer.

16 Claims, 9 Drawing Sheets

(56) References Cited

U.S. PATENT DOCUMENTS

2009/0261441 A1* 10/2009 Yasukawa ............ H01L 31/103
                                                         257/438
2015/0014632 A1    1/2015 Kim

FOREIGN PATENT DOCUMENTS

| JP | S52-11887 A | 1/1977 |
| JP | S56-81982 A | 7/1981 |
| JP | S59-88875 A | 5/1984 |
| JP | S62-143483 A | 6/1987 |
| JP | S63-226975 A | 9/1988 |
| JP | S64-71185 A | 3/1989 |
| JP | H1-214174 A | 8/1989 |
| JP | H3-94470 A | 4/1991 |
| JP | H1-147876 A | 2/1999 |
| TW | 200511574 A | 3/2005 |

* cited by examiner a.

b.

c.

d.

e.

a.

b.

c.

d.

a.

b.

c.

d.

e.

a.

b.

PHOTOSENSITIVE SEMICONDUCTOR COMPONENT, METHOD FOR FORMING A PHOTOSENSITIVE SEMICONDUCTOR COMPONENT

CROSS REFERENCE TO RELATED APPLICATIONS

This application is a 371 application of International Application No. PCT/EP2019/057847, filed Mar. 28, 2019, which claims priority to German Patent Application No. 102018107611.8, filed Mar. 29, 2018, which are both incorporated by reference as if fully set forth.

FIELD OF INVENTION

The invention relates to a photosensitive semiconductor component and to a method of forming a photosensitive semiconductor component. The invention in particular deals with phototransistors adapted to environmental light detection. Such components are used, for example, to adapt the luminosity of active optical displays to the environmental light situation, that is, for example, to control the luminosity of background illumination of displays in vehicles or mobile digital devices in dependence on environmental light.

BACKGROUND

So that environmental light transistors deliver an adapted output, they have to have a spectral sensitivity that replicates the active effects of the perception of displays, that is, on the one hand, the spectral distribution of the environmental illumination and, on the other hand, the human eyesight via the wavelength. The human eye is generally sensitive to wavelengths in the range between approximately 400 nm and 800 nm. Wavelengths shorter than 400 nm are UV light; wavelengths longer than 800 nm are infrared light (IR). UV and IR radiation are no longer perceived by the eye.

As a rule, optical sensors are insufficiently adapted to the necessities of environmental light detection. If a sensitivity over a higher spectral range is present at all, there is a very frequently relatively too high a sensitivity in the range of long wavelengths (700 nm to 800 nm, "red") and relatively too low a sensitivity in the range of short wavelengths (400 nm to 500 nm, "blue").

FIG. 9 shows a known design for the adaptation of an environmental light sensor to the requirements of environmental light detection. A cross-section through a layered semiconductor design is shown. The semiconductor component 90 can be considered as a combination of a photodiode 98 with an amplifying transistor 99. It is built up on a substrate 91 having $n^+$-doping. A more lightly doped layer 92 having $n^-$-doping is disposed above it. The p-doped layer 93 that acts as an anode for the diode 98 is diffused in the upper region of this layer 92. It is the base layer for the transistor 99 disposed directly next to it and directly connected to it. An $n^+$-doped emitting layer 94 is diffused into the base layer 93.

The adaptation of the detection characteristic takes place in that the thickness d1 of the layer 92 is set to a comparatively small value with respect to conventional photosensitive components of, for example 2.5 µm to 3 µm. Normal values are in contrast layer thicknesses of 10 µm to 30 µm. The wavelength-dependent absorption behavior of radiation in semiconductor material in conjunction with the different degrees of doping ($n^+$ in 91, $n^-$ in 92) are made use of by setting the thickness d1 to comparatively small values. Short wavelengths penetrate a correspondingly small amount into the semiconductor and are substantially absorbed in said 3 µm of the layer 92. The life-time of the generated carriers is comparatively high due to the small degree of doping of this layer so that a relatively high photocurrent resulting from the shortwave light (blue) is accordingly generated. In contrast, longwave light (red) moves at least partly deeper into the semiconductor, that is into the layer 91 from above. Red light is therefore absorbed to a noticeable degree in the substrate layer 91 of a high degree of doping $n^+$. Since the degree of doping is high there, the recombination rate is also high and the carrier life-time is comparatively short. The relative conversion of longwave (red) radiation into photocurrent is therefore smaller so that the known relative hypersensitivity of sensors to red light with respect to blue light is remedied by such a design.

It is, however, a disadvantage of this design that due to the comparatively small thickness d1 of the lightly doped layer 92, the thickness d2 of the anode/base layer 93 also has to be set relatively thin to approximately 1 µm. The emitter layer 94 is accordingly even thinner. The overall thickness of the vertical transistor 99 therefore becomes very small in the vertical direction of the plane of the drawing. This leads to huge problems in obtaining components with only slightly varying properties. With very flat designs as indicated in FIG. 9, characteristic values of the transistor can differ from one another by a factor of 5 so that the value of such components is limited.

It is therefore the object of the invention to provide a semiconductor component and a manufacturing method therefor that permit the manufacture of semiconductor components well adapted to environmental light detection with reduced variation of the characteristic values thereof.

This object is satisfied by the features of the independent claims.

SUMMARY

In accordance with the invention, a layered design of a highly doped substrate is provided as a collector, above it a qualitatively equal, but more lightly doped semiconductor layer, therein or thereabove an oppositely doped base layer, and in turn therein or thereabove regionally an emitter layer doped like the substrate. The lightly doped layer and/or the base layer here have regions of different thickness disposed laterally next to one another viewed in a vertical (perpendicular to the substrate surface) cross-section, with the transistor part of the semiconductor component being formed in the thicker region of the more lightly doped layer and/or of the base layer and the diode part in the thinner region.

To the extent that the more lightly doped layer is formed thinner in the diode region (that is thicker in the transistor region), this has the effect in the diode part of an improvement of the adaptation of the characteristic line via the above-described mechanism in that the red sensitivity is reduced. In the thicker region, in contrast, the transistor can also be of thicker construction viewed in the vertical direction of the plane of the drawing in that the more lightly doped layer, also the base layer and the emitter layer, can be configured as thicker in the thick region of the more lightly doped layer so that it is simpler to reduce variations of the transistor properties.

To the extent the base layer (in the transistor part) has a thicker region and (in the diode part) a thinner region, this has the effect that the unfavorable reaction of the base doping on the photocurrent generation is reduced by shortwave light in the more lightly doped layer disposed thereunder so that the relative sensitivity of the diode part is increased with respect to short wavelengths (blue). The thickness of the more lightly doped layer can then be selected to an approximately constant higher value than would be ideal for the red suppression, up to conventional values. The transistor part can then also be designed as thicker and therefore in a better reproducible manner.

The embodiments are preferably combined, that is both the more lightly doped layer and the base layer are formed with thinner regions in the diode part to combine the effects of red reduction and blue increase.

A method is provided for forming a photosensitive semiconductor component comprising the steps of providing a semiconductor substrate of the first conductivity type as a collector layer, forming a less doped layer of the first conductivity type thereabove, forming a semiconductor base layer of the second conductivity type therein or thereabove, forming an emitter layer of the first conductivity type therein or thereabove such that a part of the base layer region is not covered by the emitter layer, with the less doped layer and/or the semiconductor base layer being formed with regions of different thickness and with the emitter layer being formed in the region of the greatest thickness of the less doped layer and/or of the semiconductor base layer.

More specifically, a method is provided for forming a photosensitive semiconductor component comprising the steps a.) providing a semiconductor substrate of the first conductivity type as a collector layer; b.) forming a less doped layer of the first conductivity type in that a first region of the less doped layer of a first thickness that is smaller than a first threshold value is formed in a first region of the substrate surface, a second region of the less doped layer of a second thickness that is higher than a second threshold value that is higher than the first threshold value is formed on or in a second region of the substrate surface, with the first region and the second region being adjacent to one another on or in the substrate surface or having a transition region between them on or in the substrate surface on or in which a transition region of the less doped layer is formed, with the doping concentration in the less doped layer being set smaller than that of the substrate; c) forming on or in the less doped layer a semiconductor base layer of the second conductivity type having a first base layer region above at least a part of the first region of the less doped layer, having a second base layer region above at least a part of the second region of the less doped layer, and possibly having a transition base layer region above at least a part of the transition region of the less doped layer; and d) forming on or in the second base layer region of an emitter layer of the first conductivity type such that at least a part of the first base layer region is not covered by the emitter layer;

The first region and the second region of the less doped semiconductor layer can be manufactured in that a.) first, a first semiconductive layer having the lower degree of doping is applied, preferably epitaxially, to the semiconductor substrate; b.) then the first semiconductive layer is further doped above the first region of the substrate surface, preferably up to a degree of doping of the substrate or higher or lower; and c.) then a second semiconductive layer having the lower degree of doping is applied, preferably epitaxially, to the first semiconductive layer.

The first region and the second region of the less doped semiconductor layer can also be manufactured in that a.) first, a first semiconductive layer having the lower degree of doping is applied, preferably epitaxially, to the semiconductor substrate; and b.) then a second semiconductive layer is applied to the first semiconductive layer above the second region of the substrate surface and not above the first region of the substrate surface.

The first region and the second region of the less doped semiconductor layer can also be manufactured in that a.) first, a semiconductive layer having the lower degree of doping of the thickness of the second region of the less doped semiconductive region is applied, preferably epitaxially, to the semiconductor substrate; and b.) then the semiconductive layer above the first region of the substrate surface is removed, preferably by etching, for so long until the thickness of the first region of the less doped semiconductor layer has been reached.

A method as above is also provided in which a.) the less doped layer is formed as uniformly thick or non-uniformly thick on the substrate; b.) the base layer is then diffused into the less doped layer; c.) a part region of the base layer is then further deepened; and d.) the emitter layer is then formed in or above the deepened region of the base layer.

In the method as above, the first conductivity type is an n-doping and the second conductivity type is a p-doping. It can, however, also be the other way round.

A photosensitive semiconductor component has a.) a semiconductor substrate of the first conductivity type as a collector layer; b.) above it, a less doped layer of the first conductivity type having regions of different thickness; c.) a semiconductor base layer of the second conductivity type in or above at least parts of the regions of the less doped layer; and d.) an emitter layer of the first conductivity type above at least parts of the base layer, but not above at least a part of the part of the base layer disposed above the thinner region of the less doped layer.

A further photosensitive semiconductor component has a.) a semiconductor substrate of the first conductivity type as a collector layer; b.) above it, a less doped layer of the first conductivity type; c.) a semiconductor base layer of the second conductivity type having regions of different thickness above at least a part of the less doped layer; and d.) an emitter layer of the first conductivity type above at least a part of the thicker region of the base layer, but not above at least a part of the thinner region of the base layer.

BRIEF DESCRIPTION OF THE DRAWINGS

Embodiments of the invention will be described in the following with reference to the drawings; there are shown FIG. 1 an embodiment of the semiconductor component in accordance with the invention.

DETAILED DESCRIPTION OF THE PREFERRED EMBODIMENTS

Figure 1:
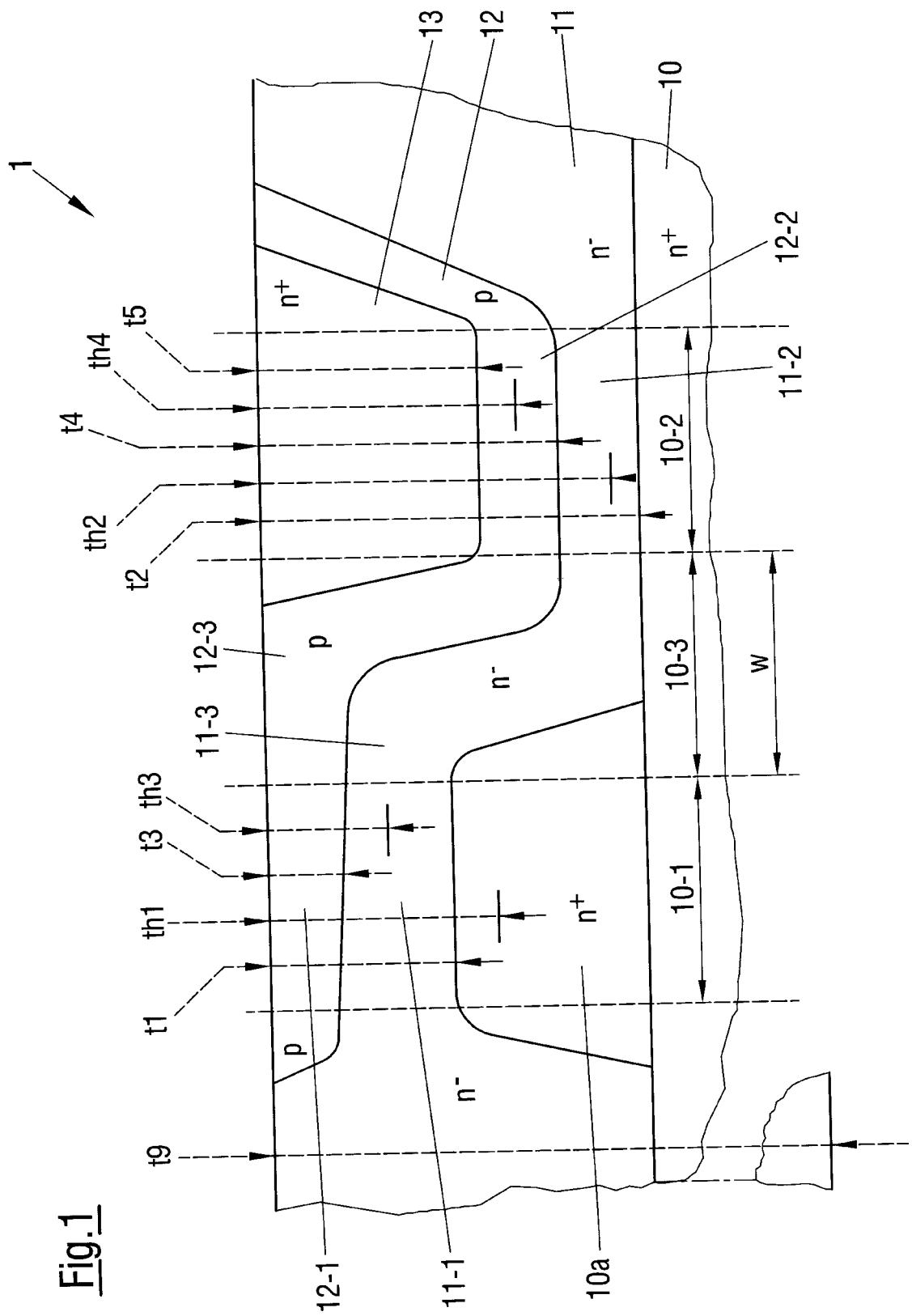
Figure 8:
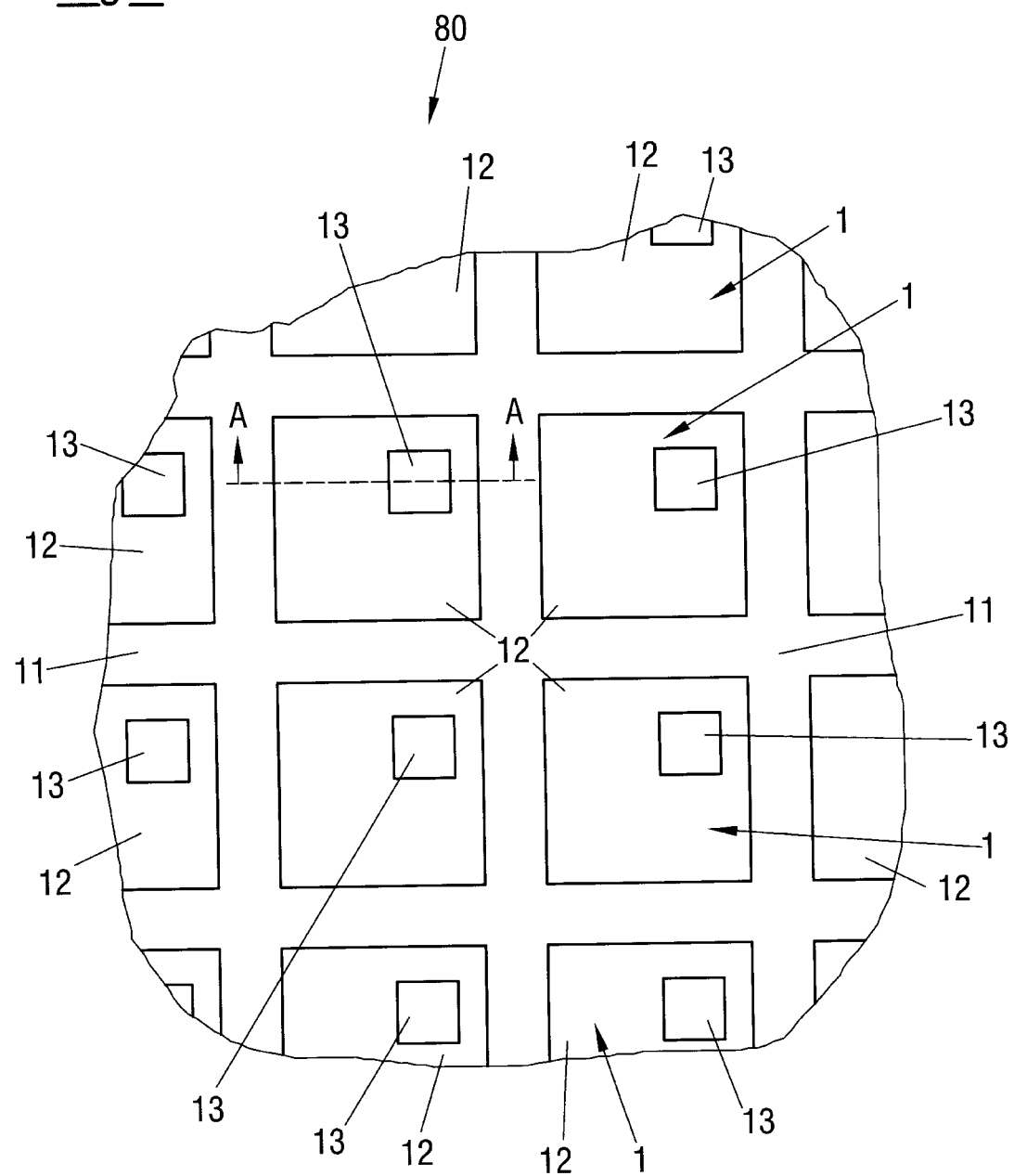
FIG. 8 a plan view of a wafer.
Figure 9:
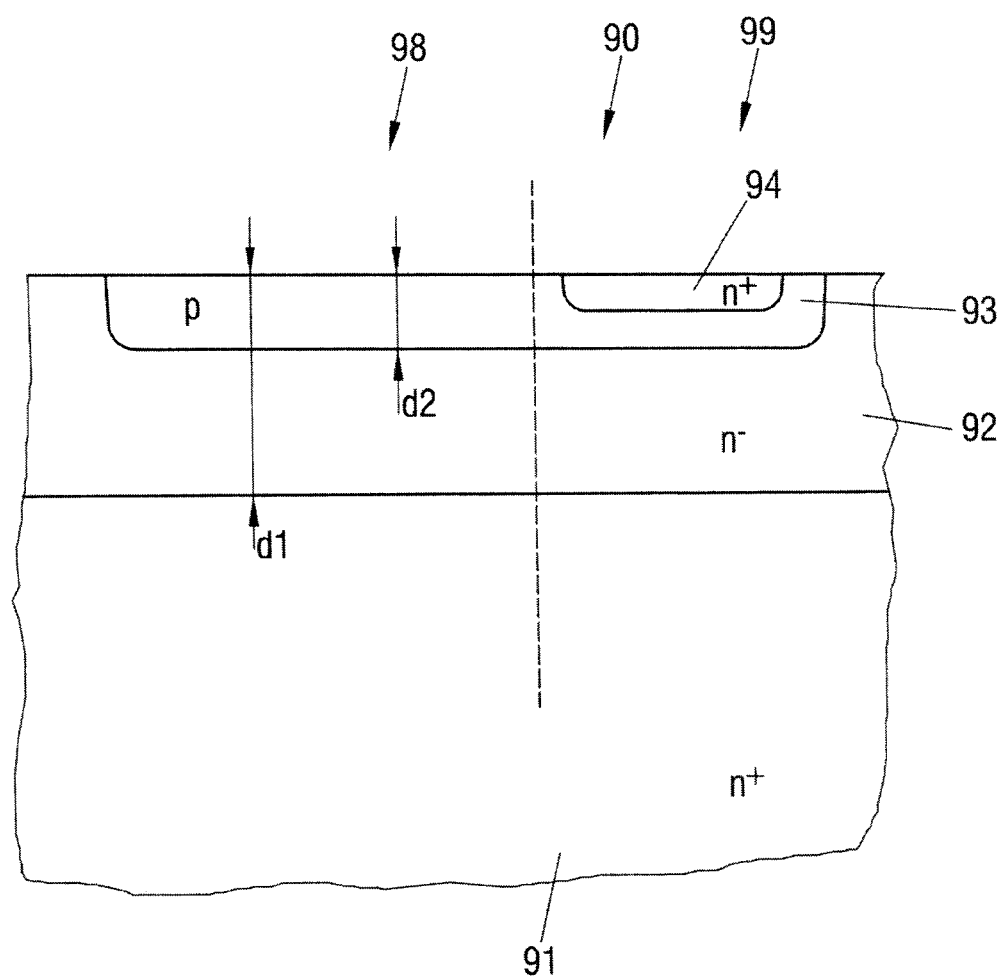
FIG. 9 an embodiment of the prior art.

FIG. 1 schematically shows the cross-section through a single semiconductor component 1. In FIG. 8, the cross-section can lie along the dashed line perpendicular to the plane of the drawing marked by the arrows A-A. It is to be assumed in FIG. 1, as in FIG. 5, that the area of incidence of light is the surface of the semiconductor component exposed at the top in the Figure. The semiconductor component is generally built up on a substrate 10 whose thickness t9 can be some 100 μm, for example greater than 200 μm or greater than 300 μm and smaller than 1 mm or smaller than 700 μm.

The substrate 10 shown in FIG. 1 is highly n-doped (n⁺). A layer 11 that is more lightly n-doped (n⁻) than the substrate is located thereabove. A p-doped base layer is marked by 12 and an n⁺-doped emitter layer is marked by 13.

FIG. 1 shows in combination a thickened portion of the lightly doped layer 11 and a thickened portion of the base layer 12 in the right part of the Figure that corresponds to the transistor region. The thickness of the lightly doped layer (as also that of other layers) is here to be understood as measured starting from the free surface 2 of the semiconductor component and therefore includes the thicknesses of the layers thereabove.

In FIG. 1, t1 designates the thickness of the more lightly doped layer 11 in its thinner region; t2 the thickness of the more lightly doped layer 11 in its thicker region; t3 the thickness of the base layer in its thinner region; and t4 the thickness of the base layer 12 in its thicker region. The drawing of FIG. 1 shows that where (right part of the Figure, transistor part of the semiconductor component) the more lightly doped layer 11 is designed as thick, the base layer 12 is also designed as thick, and vice versa (in the diode part of the semiconductor component in the left part of the Figure).

In the embodiment of FIG. 1, the different design of the thickness of the more lightly doped layer 11 is brought about in that a (lower) region of the more lightly doped layer is further doped, as described in the following. This region is the region marked by 10a in FIG. 1 that can correspond in its doping strength to that (n⁺) of the substrate 10. The thick and thin regions of the more lightly doped layer 11 and of the base layer 12 are disposed next to one another in a left to-right direction in a plan view and also in the section of FIG. 1 and at best have a transition region between them. 10-1 symbolizes a region of the substrate above which a first region 11-1 of smaller thickness of the more lightly doped layer 11 and a first region 12-1 of smaller thickness of the base layer 12 are disposed. It approximately corresponds to the diode region of the semiconductor component. 10-2 symbolizes a region of the substrate above which a second region 11-2 of the more lightly doped layer 11 of greater thickness can be disposed and/or above which a second region 12-2 of the base layer 12 of greater thickness can be disposed. It approximately corresponds to the transistor region of the semiconductor component. A transition region 10-3 of a certain width w within which said dimensions/thicknesses merge into one another can be disposed between the regions 10-1 and 10-2 on the substrate. A transition region 11-3 of the more lightly doped layer 11 and a transition region 12-3 of the base layer are disposed above the transition region 10-3 of the substrate.

The effect of the design of FIG. 1 is the following: The relationships for a suitably dimensioned red suppression are set in the region 10-1, 11-1, and 12-1 that essentially corresponds to a photodiode. The thickness t1 of the more lightly doped layer 11 is comparatively small so that a noticeable portion of the long wavelengths is absorbed in the doped region 10a that is disposed thereunder and that is e.g. doped more highly to n⁺ so that the red absorption takes place in regions of high recombination so that the contribution of the long wavelengths to the signal becomes smaller. The relationships to improve the reproducibility of transistor characteristics are set in the region 10-2, 11-2, 12-2, and 13 that essentially corresponds to a vertical bipolar transistor. The thickness t2 of the more lightly doped layer 11 and also the thickness t4 of the base layer 12 (measured from the substrate surface 2) are comparatively high so that the difficulties in obtaining reproducible characteristic values of the transistors that result from the known flat construction of the transistors is remedied.

It is pointed out that the thicknesses t1 and t2 of the regions of the more lightly doped layer 11 are determined starting from the substrate surface 2 and to this extend include the thicknesses of the respective regions of the base layer thereabove. The thickness t4 of the thicker part 12-2 of the base layer 12 in turn includes the thickness t5 of the emitter layer 13.

The transition region 10-3, 11-3, 12-3 does not have its own technical function. It is, however, effectively present as the region within which the different dimensions of the layers of the regions adjacent at both sides merge into one another. Its width w is also determined by the necessities and constraints present to this extent and can be very small.

With reference to FIGS. 2a to 2f, a manufacturing process is described for a semiconductor component having different thick regions of the more lightly doped layer 11. The method is suitable for manufacturing the embodiment of FIG. 1.

Figure 4:
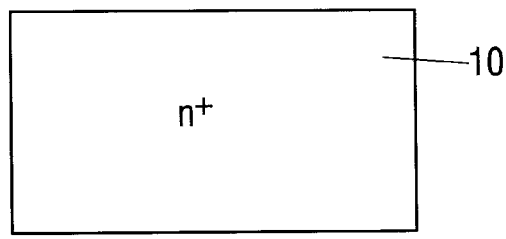
FIG. 4 schematically, a third manufacturing method.
Figure 4:
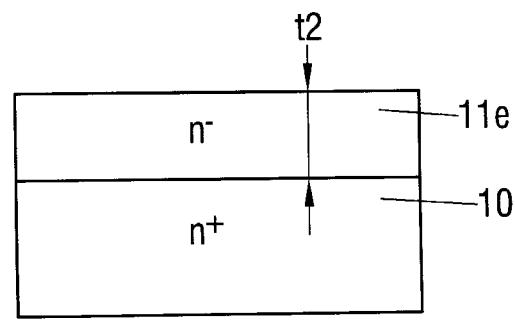
Figure 4:
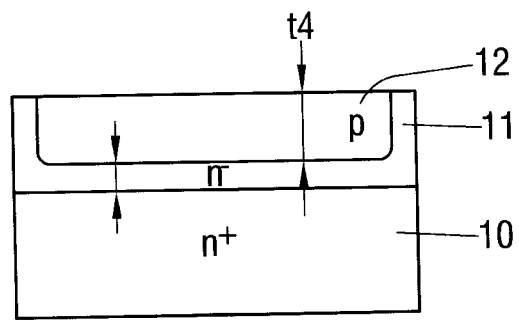
Figure 4:
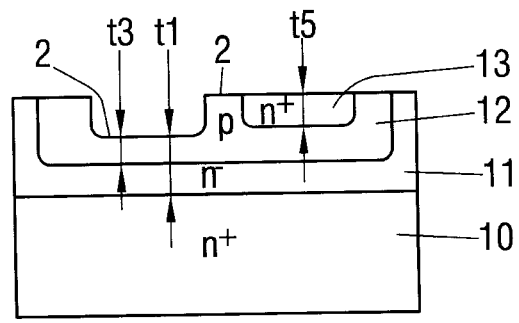
Figure 5:
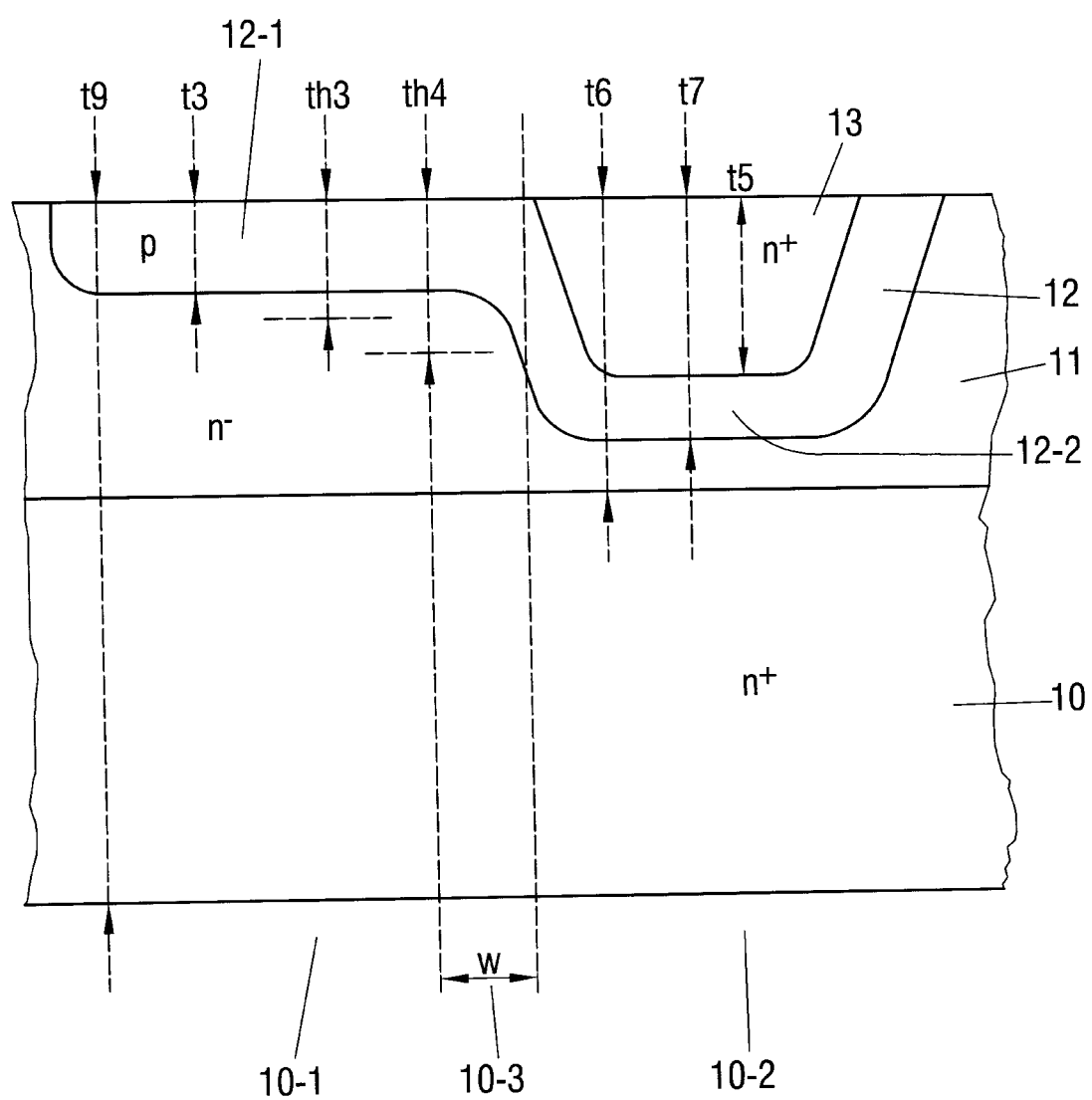
FIG. 5 the cross-section through a further embodiment of the semiconductor element.

In general, it can be said to this extent that the described semiconductor components are not produced individually, but rather as parts arranged in rows next to one another in a larger wafer such as is shown schematically in FIG. 8 for the embodiment of FIGS. 1 and 5. FIG. 8 shows by way of example the arrangement of a large number of semiconductor components 1 to be produced in a rectangular/square pattern that is reproduced on a larger wafer 70 by the manufacturing process. The semiconductor components 1 disposed next to one another are processed simultaneously in the same manner by the respective suitable process steps and are individualized at the end in that they are cut along the free spaces between them. In contrast, FIG. 2 (and also FIGS. 3, 4, and 6) show procedures and routines for a single semiconductor component 1 as if it had been produced alone. In fact, however, in many cases the production takes place in parallel with other semiconductor components 1 as indicated in FIG. 8.

FIG. 2a shows the provision of a wafer 10 composed of semiconductor material. The semiconductor material is n-doped, in particular to an n⁺-doping concentration.

In accordance with FIG. 2b, a first semiconductive layer 11a having the smaller degree of doping n⁻ is preferably applied in a surface-covering manner.

In accordance with FIG. 2c, a part of the layer 11 a is further n-doped so that it reaches an increased n-doping concentration that can, however, still be below the n⁺-concentration of the substrate 10 or can be the same or can even be higher. This part of the at one time more lowly doped layer 11 thereby practically becomes a part of the more highly doped substrate 10, which is indicated by reference numeral 10a.

In accordance with FIG. 2d, a second semiconductive layer 11b having the smaller degree of doping n⁻ is applied to the first layer 11a. After the processing shown in FIG. 2d, a more lightly doped layer 11 is present that has a thinner region of the thickness t1 at the left and a thicker region of the thickness t2 at the right.

The layers 11a and 11b can be applied by means of epitaxy. The n⁻ doping of these layers 11a and 11b preferably already takes place together with the epitaxial application of the layers.

In accordance with FIG. 2e, a base layer 12 is then formed. It is p-doped and can be thicker in the more lightly doped layer 11 than in the thinner part of the more lightly doped layer 11. In this manner, it obtains the different thicknesses t3 and t4 as shown in FIG. 2e. Only the thicker region 12-2 can first be produced here and then subsequently the thinner region 12-1 next to it. It is important that regions of the more lightly doped layer 11 remain under the respective regions of the base layer 12 that permit the formation of an appreciable space charge zone toward the more strongly doped layer of substrate 10 and further on doped region 10a.

Figure 2:
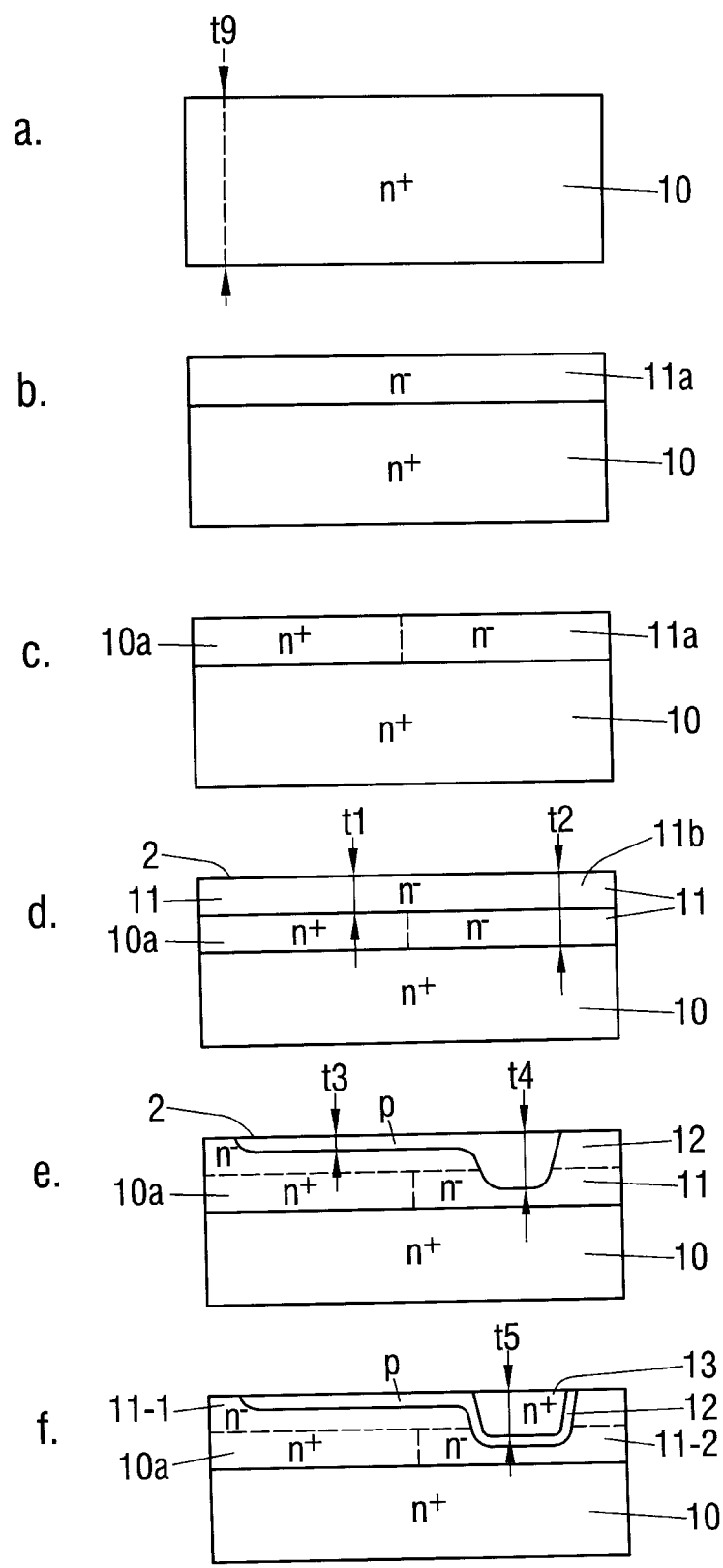
FIG. 2 schematically, a first manufacturing method.

In accordance with FIG. 2f), an emitter layer 13 of a thickness t5 is finally formed in the thicker part of the base layer 12. It can be diffused in that n-doping substances are diffused into the previously p-doped region of the base layer 12. The emitter layer 13 can act as an emitter while the substrate layer 10 can act as a collector. Viewed vertically, the emitter layer 13 leaves a part of the thicker part of the base layer 12 in place so that a vertical transistor composed of n+13, p12, n−11, and n−10 arises in this manner. In the left part of FIG. 2, in contrast, a photodiode has been produced consisting of p12, n−11, and n+10a, 10.

Figure 3:
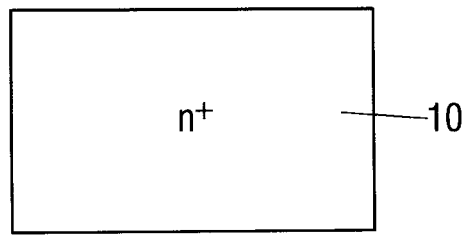
FIG. 3 schematically, a second manufacturing method.
Figure 3:
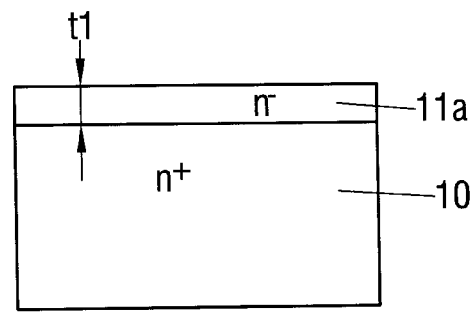
Figure 3:
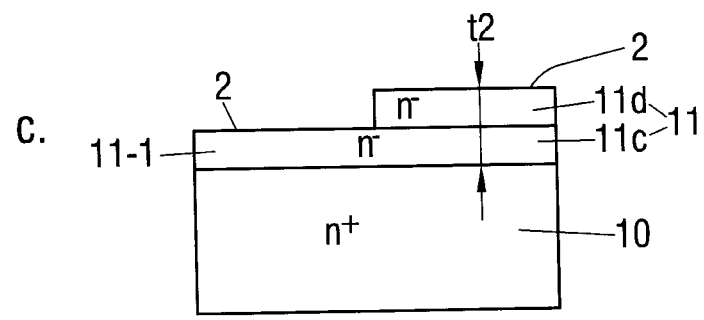
Figure 3:
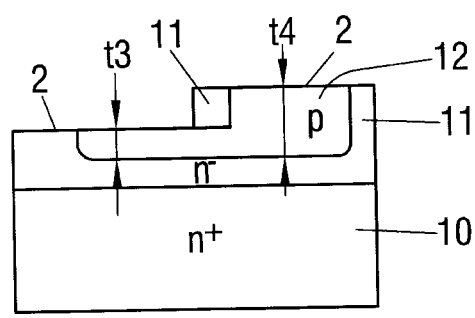
Figure 3:
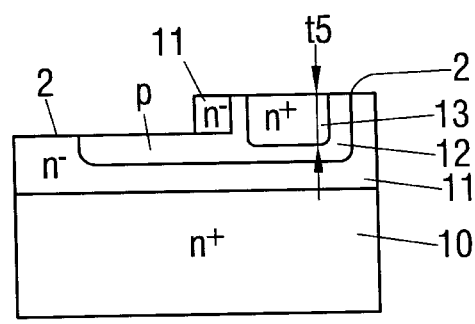

FIG. 3 shows a further possibility of forming a semiconductor component having different thick regions of the more lightly doped layer 11. The steps of FIGS. 3a and 3b qualitatively correspond to those of FIGS. 2a and 2b are will not be further explained. However, the thickness t1 of the first semiconductive layer 11a is the same as that that is last desired for the thinner region 11-1 of the more lightly doped layer 11.

A second semiconductive n−-layer 11d of the smaller degree of doping is applied over a part of the first semiconductive layer 11a—on the right side in FIG. 3c. The layers 11c and 11d can here also again be applied by means of epitaxy by, for example, suitable masks. The second semiconductive layer 11d is produced such that the total thickness of the two layers 11c and 11d of the last desired thickness t2 corresponds to the thicker region 11-2 of the more lightly doped layer 11. The substrate surface 2 is then no longer formed as plane, but as stepped.

In accordance with FIG. 3d, a base layer 12 is then produced, for instance by diffusing p-material from above into the surface. This can take place such that the base layer 12 has a smaller thickness t3 in the thinner region 11-1 of the more lightly doped layer 11 than in the thicker region 11-2 of the less doped layer 11 where the base layer 12 has a thickness t4 that is greater than t3. Production can take place such that a region of the less doped layer 11 remains in place to the left of the region of the base layer 12 reaching to the surface 2.

Finally, in accordance with FIG. 3e, the emitter layer 13 is formed that can be produced by implanting n-material from above up to the desired thickness t5 that is smaller than t4.

As a result, a semiconductor component is obtained that corresponds to that of FIG. 2 in its electrical properties.

FIG. 4 shows a further embodiment of a manufacturing method of the semiconductor component. FIGS. 4a and 4b qualitatively correspond to those of FIG. 2 and will not be separately explained. However, the more lightly doped layer 11e is produced from the start with a thickness t2, for instance by means of epitaxy, that corresponds to the last desired thickness of the thicker region 11-2 of the more lightly doped layer 11. In this manner, the layered design of the more strongly doped substrate 10 is produced having an n+-concentration as a collector layer and of the more lightly doped layer 11 having an n−-concentration.

In accordance with FIG. 4c, a base layer 12 is then produced, for instance in that p-material is diffused into the more lightly doped layer 11 from above. This takes place up to the reaching of a layer thickness t4 that corresponds to the last desired layer thickness of the thicker region 12-2 of the base layer 12.

For reasons of simplicity, FIG. 4d shows two further worksteps in combination that can be carried out in each of the two possible sequences. On the one hand, a part of the base layer 12 is removed, for instance by etching, so that the base layer 12 adopts a thickness t3 in this region and following this the more lightly doped layer 11, measured from the component surface 2, adopts a reduced thickness t1. On the other hand, the emitter layer t3 is produced in the remaining thicker part of the base layer 12 up to a thickness t5, for instance by diffusing in n-material.

FIG. 5 shows an embodiment in which the more lightly (n−)-doped layer 11 has a substantially constant thickness t6, but the base layer has regions of different thickness as already qualitatively described beforehand. It has been found that the provision of a thin base region (thickness t3 in FIG. 5) in the region of the photodiode also already has the effect per se of an improvement of the adaptation of the component characteristics in that the negative reaction of the base doping on the processes in the space charge zone in the more lightly doped layer 11 thereunder are thereby reduced. The thickness t6 of the more lightly doped layer 11 can therefore be selected at a higher value than optimal for the red reduction so that the transistor region can also be produced correspondingly thicker and thus having more easily reproducible characteristic values. The effort for the production of differently thick regions 11-1, 11-2 of the more lightly doped layer 11 is saved with this construction.

Figure 6:
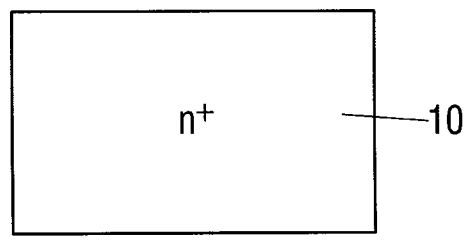
FIG. 6 a further manufacturing method.
Figure 6:
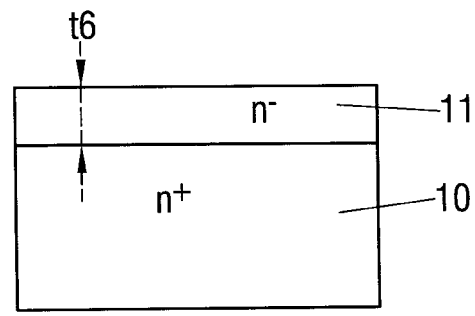
Figure 6:
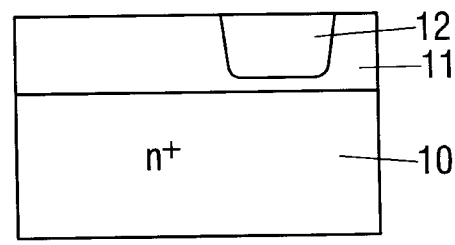
Figure 6:
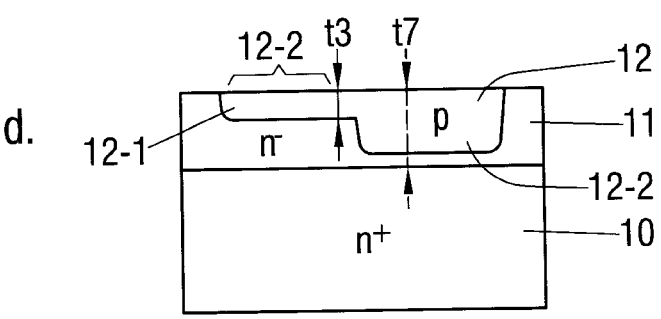
Figure 6:
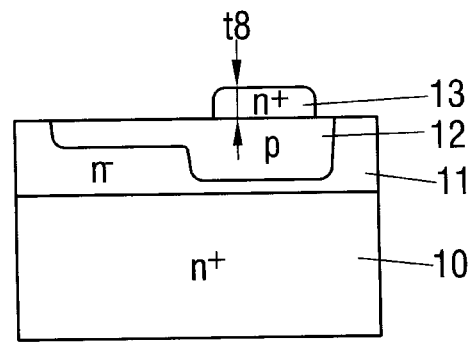

FIG. 6 shows a method of forming a semiconductor component having a constant thickness of the more lightly doped layer 11 as qualitatively shown in FIG. 5. In accordance with FIG. 6a, as described above, a substrate 10 having n+-doping is first provided.

In accordance with FIG. 6b, a layer 11 having an n−-concentration is formed thereon, for example by means of epitaxy. It is produced with the last desired layer thickness t6.

In accordance with FIG. 6c and FIG. 6d, a base layer 12 having regions of different layer thickness are then formed, for instance in that, as indicated in FIG. 6c, a uniformly deep layer of a thickness t7 is produced with p-doping in a part region of the semiconductor (transistor region) until the desired thicker layer thickness t7 is reached as the final depth. As shown in FIG. 6d, a less deep layer 12-2 of the thickness t3 is then produced with p-doping in an adjacent region (diode region) until the desired weaker layer thickness t3 is reached as the second final depth.

Depending on the dimensioning relationships, as shown in FIG. 5, an emitter layer 13 can then be diffused into the thicker region of the base layer 12 or, as shown in FIG. 6e, it can again be applied separately to the thicker region of the base layer up to a thickness t8. The latter can again take place by means of epitaxy. In this manner of construction, the thickness of the emitter layer is not considered in that of the thick regions of the base layer and of the more lightly doped layer.

Figure 7:
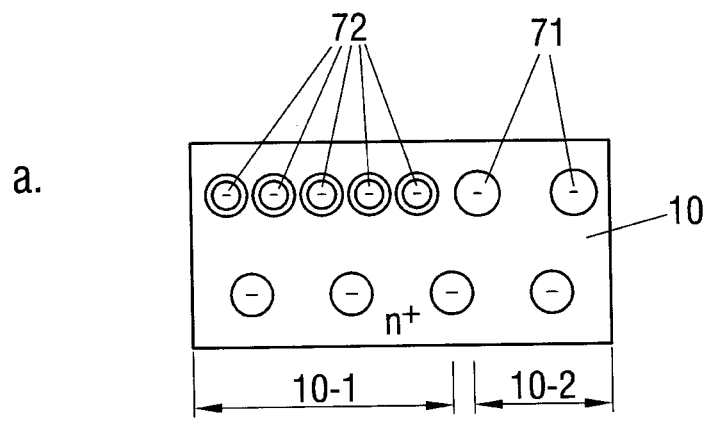
FIG. 7 a further manufacturing method.
Figure 7:
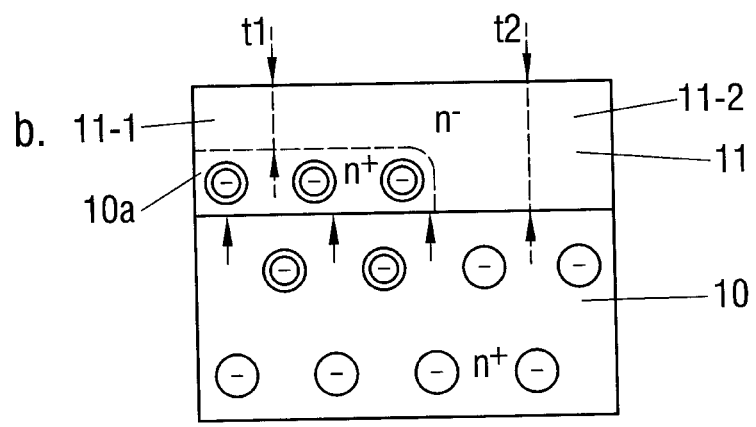

FIG. 7 shows the start of a further manufacturing process. An n+-doped substrate 10 having differently doped regions is produced. A uniform n+ base doping can first be generated. More mobile doping substances 72 (phosphorous for n-doping, for instance) and/or doping substances in higher concentrations are then additionally diffused in the region 10-1 of the later photodiode, which no longer takes place in the region 10-2 of the later transistor so that the n⁺-base doping persists there with the less mobile doping substances 71 (arsenic, antimony for n-doping, for instance), as shown in FIG. 7a. More mobile doping substances such as phosphorous for n-doping or aluminum for p-doping have a higher diffusion coefficient compared with other doping substances that reflects a greater diffusion tendency with otherwise unchanged conditions compared with other doping substances.

In the next step, the less doped layer 11 is then built up thereabove, for instance by means of epitaxy. The more mobile n-doping substances 72 diffuse into the upwardly adjacent a priori less doped layer 11 simultaneously with the layer build-up and/or in a step separately induced thereafter in the region 10-1 of the diode so that, viewed vertically, the smaller doping of said layer 11 in the lower region 10a increases to a higher value up to approximately n⁺ due to the diffusion from below. In this manner, the doping atoms 72 diffused from above effect a reduction of the thickness of the less doped layer of t2 in the transistor region above the substrate region 10-2 to t1 in the diode region above the substrate region 10-1.

The process can then be continued as shown in FIG. 2.

A transistor of a comparatively high vertical dimension is produced in this manner so that its characteristic values can also be set sufficiently exactly. The adaptation of the component characteristic to the daylight detection takes place by the provision of the thin region 12-2 of the base layer 12, as described further above.

It must generally be stated with respect to the manufacturing processes that they also comprise the steps, not shown, of attaching contacts to at least the collector emitter layers 10 and 13, the individualization, the encasing, the contacting, and further steps.

In a plan view, the individual regions in FIG. 8 can appear as insular, that is such that the base regions 12 of the individual semiconductor components are separated from one another by more lightly doped regions 11 along which the individualization then takes place. The respective present emitter layers 13 can be disposed in an insular manner completely within the respective base layer 12.

The specifications of dimensions now take place that are each to be understood per se and in their selected representation combination as optional, even if they are specified without conditions in the following. The specifications are to be understood as combinable in any desired manner with one another where this is technically possible.

The wafer 10 can have a thickness t9 that is higher than 100 μm or higher than 200 μm or higher than 300 μm or higher than 400 μm, and that is smaller than 1 mm or smaller than 800 μm.

The net layer thickness of the more lightly doped layer 11 (taken between the lower limit of the base layer 12 and the upper limit of the highly doped layer 10, 10a in the vertical direction of the plane of the drawing) can be at least 1 μm or at least 2 μm and/or at most 5 μm or at most 4 μm or at most 3 μm in its first region 11-1 and in its second region 11-2.

The thickness t1 of the thin region of the more lightly doped layer 11 is smaller than a first threshold value th1 and the thickness t2 of the thicker part 11-2 of the more lightly doped layer 11 is greater than a second threshold value th2. The first threshold value th1 can be 7 μm or 5 μm or 4 μm or 3 μm or 2 μm. The second threshold value th2 can be 4 μm or 5 μm or can generally be the k2-fold of the first threshold value, where k2 is 1.1 or 1.2 or 1.5 or 2. The minimum thickness t1 of the first region 11-1 of the less doped layer 11 can be greater than k1 times the first threshold value th1, where k1 is 0.1 or 0.2 or 0.3. The maximum thickness t2 of the second region 11-2 of the less doped layer 11 can be smaller than k3 times the second threshold value th2, where k3 is 5 or 3 or 2 or 1.5.

The first base layer region 12-1 can have a thickness t3 that is smaller than a third threshold value th3 and is greater than 0.1 times or 0.2 times the third threshold value t3, where the third threshold value can be 3 mm or 2 μm or 0.2 times or 0.3 times or 0.4 times the first threshold value th1. The second base layer region 12-2 can have a thickness t4 that is greater than a fourth threshold value th4 and that is smaller than 3 times or 2 times or 1.5 times the fourth threshold value th4, where the fourth threshold value can be 2 μm or 3 μm or 4 μm or 1.5 times or 2 times or 3 times the third threshold value th3.

The width w of the transition region 10-3 can be smaller than k4 times the first threshold value th1 or k4 times the thickness of the first region 11-1 of the less doped layer 11, where k4 is 3 or 2 or 1 or 0.5 or 0.2.

The first base layer region 12-1 can have a thickness t3 that is less than k5 times the thickness t4 of the second base layer region 12-2, where k5 can be 1 or 0.9 or 0.7 or 0.5 or 0.4.

The thickness t3 of the first region 12-1 of the base layer 12 can be k6 times the thickness t1 of the first region 11-1 of the more lightly doped layer 11, where k6 is greater than 0.2 or greater than 0.3 and/or smaller than 0.5 or smaller than 0.3 or smaller than 0.1 or smaller than 0.05.

The thickness t4 of the second region 12-2 of the base layer 12 can be k7 times the thickness t3 of the second region 11-2 of the more lightly doped layer 11, where k7 is greater than 0.1 or greater than 0.2 or greater than 0.5 or greater than 0.6 and/or smaller than 0.9 or smaller than 0.8 or smaller than 0.7.

The thickness t5 of the emitter layer 13 can be k8 times the thickness t4 of the second region 12-2 of the base layer 12, where k8 is greater than 0.2 or greater than 0.4 or greater than 0.6 and/or smaller than 0.99 or smaller than 0.9 or smaller than 0.8 or smaller than 0.7.

The thickness t6 of the more lightly doped layer 11 in FIG. 5 can be thicker than a lower limit that is 3 μm or 4 μm or 5 μm and can be thinner than an upper limit that is 15 μm or 10 μm or 8 μm or 6 μm. The thickness t7 of the thick region 12-2 of the base layer can have the dimension of t4 of FIG. 1. The threshold values th3 and th4 for the formation of the differently thick regions 12-2 and 12-2 of the base layer 12 can be as described with reference to FIG. 1 or can be reduced with respect to it by 20% or by 30% or by 40%. The thickness t5 of the emitter layer 13 as shown in FIG. 5 can be as described with reference to FIG. 1 or can be reduced with respect to it by 20% or by 30% or by 40%. The thickness t8 of the emitter layer 13 as shown in FIG. 6 can be thicker than a lower limit that is 1 μm or 2 μm and can be thinner than an upper limit that is 6 μm or 5 μm or 4 μm or 3 μm.

The dimensions in a plan view can be as follows: A semiconductor component can have a dimension of a*b, where a can be between 0.3 mm and 1 mm, preferably approximately 0.7 mm, and b can be between 0.3 mm and 1 mm, preferably 0.7 mm. The transistor part can adopt 5%-35%, preferably 17% to 22%, of the surface; the diode 65% to 95%, preferably 78% to 83%, of the surface.

The following degrees of doping can be present:
Substrate 10: n+, $10^{17}$–$3*10^{19}$
Less doped layer 11: n−, $5*10^{12}$–$10^{16}$ Base layer 12: p, $10^{15}$–$10^{18}$
Emitter layer 13: n+, $5*10^{18}$–$10^{20}$ In the present description, features should also be understood as combinable with one another when their combination is not explicitly described as long as the combination is technically possible. Features that are described in a specific context or in a Figure or in a claim or in an embodiment should also be understood as detachable from this context, this Figure, this claim, or this embodiment and should be understood as combinable with other contexts, Figures, claims, and embodiments as long as the combination is technically possible. Descriptions of method steps should also be understood as a description of the product produced therewith, and vice versa.

To the extent that layer thicknesses are addressed or dimensioned, they are to be understood as starting from the substrate surface referenced up to the remotely disposed layer boundary if nothing specifically different results. If a parameter such as t1, for instance, is associated with a thickness, this does not per se mean that the thickness necessarily has to have a constant value. If the transitions between layers are not sharply delineated, center values of the transition region can be assumed as the layer boundary. If (substantially) constant layer thicknesses are addressed, thicknesses having a tolerance of ±10% or ±5% or ±2% of the nominal value should be understood thereby. If the base layer is addressed, it will not have the function of a transistor base over its total extent. It acts regionally as a part of the diode, in particular its anode.

To simplify the description of the invention, NPN transistors are shown in the drawings. They or the individual layers are also addressed as such in part in the description. However, this should not preclude that structures inverse thereto (PNP transistors) can also be used with the invention. The conductivities are addressed in the conventional manner in the claims as a first conductivity type and a second conductivity type. In the drawings, the first conductivity type is an n-doping and the second conductivity type is a p-doping. Although the drawings and the description only describe this association, this should not preclude that the arrangement can also be the other way round, that is the first conductivity type is a p-doping and the second conductivity type is an n-doping.

The naming of a first region 10-1 of the substrate, a second region 10-2 of the substrate, and a transition region 10-3 of the substrate primarily serves for the description of the spatial arrangement of the regions of individual layers disposed thereabove. These regions cannot be distinguished on the substrate itself in a large number of embodiments.

The invention claimed is:

1. A method of forming a photosensitive semiconductor component, the method comprising:
   (i) providing a semiconductor substrate of a first conductivity type as a collector layer;
   (ii) forming a less doped layer of the first conductivity type above the semiconductor substrate;
   (iii) forming a semiconductor base layer of a second conductivity type therein or thereabove;
   (iv) forming an emitter layer of the first conductivity type therein or thereabove, such that a part of the base layer is not covered by the emitter layer,
   wherein at least one of the less doped layer or the semiconductor base layer is formed with regions of different thicknesses including a region of greatest thickness and a region of smaller thickness that has a thickness that is smaller than the thickness of the region of greatest thickness, and thereafter the emitter layer is formed in the region having the greatest thickness of the at least one of the less doped layer or the semiconductor base layer, wherein the emitter layer is formed with a thickness which is greater than the smaller thickness of the at least one of the less doped layer or the semiconductor base layer.

2. A method of forming a photosensitive semiconductor component, the method comprising:
   (i) providing a semiconductor substrate of a first conductivity type as a collector layer;
   (ii) forming a less doped layer of the first conductivity type above the semiconductor substrate, wherein
      a first region of the less doped layer of a first thickness that is smaller than a first threshold value is formed on or in a first region of the substrate,
      a second region of the less doped layer of a second thickness that is higher than a second threshold value that is higher than the first threshold value is formed on or in a second region of the semiconductor substrate,
      wherein the first region and the second region are adjacent to one another on or in the semiconductor substrate, or include a transition region between them on or in the semiconductor substrate on, or in which transition region a transition region of the less doped layer is formed, and
      wherein a doping concentration in the less doped layer is set as smaller than that of the semiconductor substrate;
   (iii) forming a semiconductor base layer of a second conductivity type therein or thereabove wherein said semiconductor base layer of the second conductivity type is formed such that it has a first base layer region above at least a part of the first region of the less doped layer, a second base layer region above at least a part of the second region of the less doped layer, and a transition base layer region above at least a part of the transition region of the less doped layer; and
   (iv) forming an emitter layer of the first conductivity type therein or thereabove, such that a part of the base layer is not covered by the emitter layer, wherein said emitter layer of the first conductivity type is formed on or in the second base layer region such that at least a part of the first base layer region is not covered by the emitter layer;
   wherein at least one of the less doped layer or the semiconductor base layer is formed with regions of different thickness, and thereafter the emitter layer is formed in a region having a greatest thickness of the at least one of the less doped layer or the semiconductor base layer.

3. The method in accordance with claim 2, in which the first region and the second region of the less doped layer are manufactured such that
   a first semiconductive layer having the smaller degree of doping is first applied, preferably epitaxially, to the semiconductor substrate;
   then the first semiconductive layer is further doped above the first region of the semiconductor substrate, preferably up to a degree of doping of the semiconductor substrate or higher or lower; and
   then a second semiconductive layer having the smaller degree of doping is applied, preferably epitaxially, to the first semiconductive layer.

4. The method in accordance with claim 2, in which the first region and the second region of the less doped layer are manufactured such that:

a first semiconductive layer having the smaller degree of doping is first applied, preferably epitaxially, to the semiconductor substrate and then a second semiconductive layer is applied to the first semiconductive layer above the second region of the semiconductor substrate and not above the first region of the semiconductor substrate.

5. The method in accordance with claim 2, in which the first region and the second region of the less doped layer are manufactured such that:

a semiconductive layer having the smaller degree of doping of a thickness of the second region of the less doped layer is first applied, preferably epitaxially, to the semiconductor substrate; and then the semiconductive layer above the first region of the semiconductor substrate is removed, preferably by etching, for so long until the thickness of the first region of the less doped layer has been reached.

6. The method in accordance with claim 1, wherein the less doped layer is formed as uniformly thick or non-uniformly thick on the semiconductor substrate;

the base layer is diffused into the less doped layer up to a first final depth in a part region of the less doped layer, optionally in its thicker region;

then the base layer is diffused into the less doped layer up to a second final depth that is smaller than a first end depth in an adjacent region of the less doped layer; and the emitter layer is then formed in or above a deeper region of the base layer.

7. The method in accordance with claim 1, wherein the semiconductor substrate is formed with a region of at least one of highly mobile or highly concentrated doping substances;

the less doped layer is formed on the semiconductor substrate such that doping substances diffuse from the region of the semiconductor substrate having highly mobile or highly concentrated doping substances into an adjacent region of the less doped layer.

8. The method in accordance with claim 2, wherein the first threshold value is set to 7 µm or 5 µm or 4 µm or 3 µm or 2 µm, and the thickness of the first region of the less doped layer is set to greater than k1 times the first threshold value, where k1 is 0.1 or 0.2.

9. The method in accordance with claim 2, wherein the second threshold value equals k2 times the first threshold value, or 4 µm or 5 µm, where k2 is 1.1 or 1.2 or 1.5 or 2; and the thickness of the second region of the less doped layer is smaller than k3 times the second threshold value, where k3 is 5 or 3 or 2.

10. The method in accordance with claim 2, wherein the first base layer region has a thickness that is smaller than a third threshold value and that is greater than 0.1 times or 0.2 times the third threshold value, where the third threshold value is 3 µm or 2 µm, or 0.2 times or 0.3 times or 0.4 times the first threshold value; and the second base layer region has a thickness that is greater than a fourth threshold value and that is smaller than 3 times or 2 times the fourth threshold value, with the fourth threshold value being 2 µm or 3 µm or 4 µm or 5 µm, or 1.2 times or 1.5 times or 2 times the third threshold value.

11. The method in accordance with claim 2, wherein a width of the transition region becomes smaller than k4 times the first threshold value or k4 times the thickness of the first region of the less doped layer, with k4 being 3 or 2 or 1 or 0.5.

12. The method in accordance with claim 2, wherein the first base layer region receives a thickness that is smaller than k5 times the thickness of the second base layer region, with k5 being 1 or 0.9 or 0.7 or 0.5.

13. A method of forming a photosensitive semiconductor component, the method comprising:

(i) providing a semiconductor substrate of a first conductivity type as a collector layer;

(ii) forming a less doped layer of the first conductivity type above the semiconductor substrate;

(iii) forming a semiconductor base layer of a second conductivity type therein or thereabove;

(iv) forming an emitter layer of the first conductivity type therein or thereabove, such that a part of the base layer is not covered by the emitter layer, wherein at least one of the less doped layer or the semiconductor base layer is formed with regions of different thickness, and thereafter the emitter layer is formed in a region having a greatest thickness of the at least one of the less doped layer or the semiconductor base layer; and wherein the thickness of a first region of the base layer is k6 times the thickness of a first region of the less doped layer, where k6 is greater than 0.2, greater than 0.3, smaller than 0.5, smaller than 0.3, smaller than 0.1, or smaller than 0.05; or the thickness of a second region of the base layer is k7 times the thickness of a second region of the less doped layer, where k7 is greater than 0.1, greater than 0.2, greater than 0.5, greater than 0.6, smaller than 0.9, smaller than 0.8, or smaller than 0.7; or the thickness of the emitter layer is k8 times the thickness of the second region of the base layer, where k8 is greater than 0.2, greater than 0.4, greater than 0.6, smaller than 0.99, smaller than 0.9, smaller than 0.8, or smaller than 0.7.

14. The method in accordance with claim 1, wherein the first conductivity type is an n-doping and the second conductivity type is a p-doping, or vice versa.

15. A photosensitive semiconductor component comprising a semiconductor substrate of a first conductivity type as a collector layer;

a less doped layer of the first conductivity type having regions of different thickness and arranged above the semiconductor substrate, the less doped layer including at least a thin region and a thick region that is deeper than the thin region;

a semiconductor base layer of a second conductivity type above at least a portion of the less doped layer; and an emitter layer of the first conductivity type above at least a portion of the base layer disposed above the thick region of the less doped layer, but not above a portion of the base layer disposed above the thin region of the less doped layer, wherein the thickness of the emitter layer is greater than the thickness of the portion of the base layer disposed above the thin region of the less doped layer.

16. A photosensitive semiconductor component comprising a semiconductor substrate of a first conductivity type as a collector layer;

a less doped layer of the first conductivity type arranged above the semiconductor substrate;

a semiconductor base layer of a second conductivity type having regions of different thickness above at least a part of the less doped layer, the base layer including at least a thin region and a thick region that is deeper than the thin region; and an emitter layer of the first conductivity type above at least a part of the thick region of the base layer, but not above at least a part of the thin region of the base layer, wherein the thickness of the emitter layer is greater than the thickness of the thin region of the base layer.

* * * * *